United States Patent
Russell et al.

(10) Patent No.: US 7,523,373 B2
(45) Date of Patent: Apr. 21, 2009

(54) MINIMUM MEMORY OPERATING VOLTAGE TECHNIQUE

(75) Inventors: Andrew C. Russell, Austin, TX (US); David R. Bearden, Austin, TX (US); Bradford L. Hunter, South Burlington, VT (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 294 days.

(21) Appl. No.: 11/468,458

(22) Filed: Aug. 30, 2006

(65) Prior Publication Data

US 2008/0082873 A1 Apr. 3, 2008

(51) Int. Cl.
*G01R 31/30* (2006.01)
(52) U.S. Cl. .................. 714/745; 713/300; 324/765
(58) Field of Classification Search ............. 714/745, 714/721
See application file for complete search history.

(56) References Cited

U.S. PATENT DOCUMENTS 5,086,501 A * 2/1992 DeLuca et al. ............. 713/300
5,764,529 A 6/1998 Capps, Jr. et al.
6,448,672 B1 * 9/2002 Voegeli et al. ................ 307/52
6,748,545 B1 * 6/2004 Helms ........................ 713/300
6,772,379 B1 * 8/2004 Camera et al. .............. 714/721
6,836,848 B2 12/2004 Yu et al.
6,975,551 B2 * 12/2005 Iwata et al. ................. 365/226
2006/0044917 A1 3/2006 Kawakami et al.
2006/0279318 A1 * 12/2006 Iwaya ......................... 324/765
2007/0174642 A1 * 7/2007 Cornwell et al. ............ 713/300

* cited by examiner

*Primary Examiner*—Cynthia Britt
*Assistant Examiner*—Steve Nguyen
(74) *Attorney, Agent, or Firm*—Joanna G. Chiu; James L. Clingan, Jr.

(57) ABSTRACT

A method includes an integrated circuit with a memory. The memory operates with an operating voltage. A value of a minimum operating voltage of the memory is determined. The value of the minimum operating voltage is stored in a non-volatile memory location that maybe a non-volatile register. This minimum operating voltage information can then be used in determining when an alternative power supply voltage may be switched to the memory or ensuring that the minimum voltage is otherwise met. The minimum voltage can be used only internal to the integrated circuit or also provided externally to a user.

16 Claims, 3 Drawing Sheets

MINIMUM MEMORY OPERATING VOLTAGE TECHNIQUE

FIELD OF THE INVENTION

Embodiments herein relate generally to memories, and more specifically, to a minimum memory operating voltage technique.

RELATED ART

Today, processors are typically able to operate at different voltages and frequencies, depending on the desired performance. For example, processors may operate at maximum voltage and frequency when peak performance is required, and may operate at low voltage and frequency to reduce power consumption. Therefore, tradeoffs can be made between performance and power. Similarly, such tradeoffs between performance and power can be made for other circuitry within data processing systems such as memories. That is, memories may be able to operate at higher voltages to achieve greater speed, and may also operate at lower voltages to save power. However, note that different types of circuitry within a data processing system may have different ranges of allowable operating voltages.

BRIEF DESCRIPTION OF THE DRAWINGS

The present invention is illustrated by way of example and is not limited by the accompanying figures, in which like references indicate similar elements.

Figure 1:
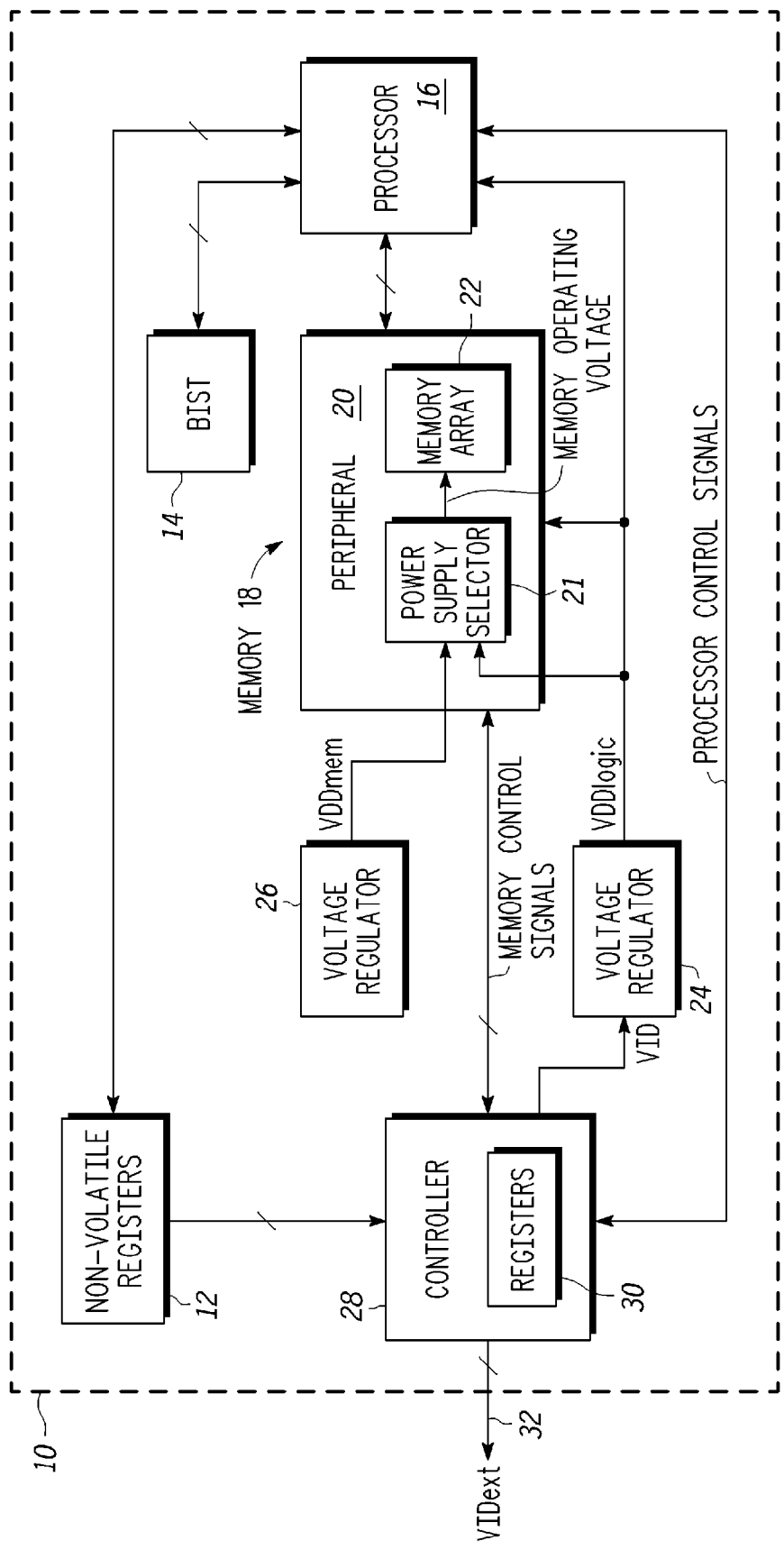
FIG. 1 illustrates a data processing system in accordance with one embodiment of the present invention.

Skilled artisans appreciate that elements in the figures are illustrated for simplicity and clarity and have not necessarily been drawn to scale.

For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

As discussed above, tradeoffs between power and performance can be made for processors and for memory by varying the operating voltage and frequency. However, in one embodiment, the memory in a data processing system may fail at a higher voltage than the processor. That is, the processor may be able to operate at a lower voltage than is possible for the memory. Therefore, in many embodiments, the memory has a higher minimum operating voltage than the processor. Note that, as used herein, the minimum voltage or minimum operating voltage refers to a minimum which takes into consideration factors such as, for example, temperature. That is, there may be situations where the memory may actually be able to work at a voltage lower than the minimum voltage depending on, for example, factors such as temperature.

Furthermore, this minimum operating voltage for a memory varies across parts, such that one integrated circuit (IC) may tolerate one minimum operating voltage while another IC may be able to tolerate even a lower operating voltage, depending on the worst case bitcell present in each IC. Therefore, setting a particular minimum operating voltage for a type of memory, such as for a range of parts, which takes into consideration a worst case scenario for all the parts may be unnecessarily giving up the possibility for some parts to be qualified to operate at even lower voltages if those particular parts have, for example, more robust bitcells, none of which fall into the worst case scenario. Therefore, in one embodiment, each particular part, or IC, is tested to determine values for one or more minimum operating voltages, and these values of the one or more operating voltages are then stored in non-volatile memory locations on the part, such as through the use of non-volatile registers or fuses. These programmed non-volatile memory locations may then be used, for example, to bin the parts differently, control voltage during operation of the IC, etc.

FIG. 1 illustrates a block diagram of a data processing system 10 in accordance with one embodiment of the present invention. System 10 includes a processor 16, built-in test (BIST) circuitry 14, a memory 18, non-volatile registers 12, a controller 28, and voltage regulators 24 and 26. Processor 16 is bidirectionally coupled to non-volatile registers 12, BIST 14, memory 18, and controller 28. Memory 18 may be any type of memory, such as, for example, a static random access memory (SRAM), a dynamic random access memory (DRAM), etc. Memory 18 may be located external to processor 16, as illustrated, or may be located within processor 16. Memory 18 may be, for example, a cache, an embedded memory, or a stand alone memory. Memory 18 includes a memory array 22 which includes an array of bitcells which stores information. Memory 18 also includes a power supply selector 21 which receives VDDmem and VDDlogic and provides one of these to memory array 22 as the memory operating voltage. Power supply selector 21 selects one of VDDmem and VDDlogic based on information provided by controller 28 via, for example, the memory control signals. Note that in an alternate embodiment, power supply selector 21 may be located outside memory 18. In yet another embodiment, power supply selector 21 is not present and memory 18 is permanently coupled to VDDlogic or VDDmem. Memory 18 also includes periphery circuitry 20 which includes the circuitry used to read and write memory array 22. For example, periphery 20 may include row and column decoders, sense amplifiers, etc. In the illustrated embodiment, periphery 20 is coupled to receive VDDlogic as its power supply. Memory 18 can be any type of memory which operates as known in the art, and therefore, will only be discussed to the extent necessary to understand various embodiments of the present invention.

Controller 28 provides memory control signals to memory 18 and processor control signals to processor 16. Controller 28 also provides a voltage identifier (VID) to voltage regulator 24 which corresponds to a desired voltage for the output of voltage regulator 24 (e.g. VDDlogic). Controller 28 may also provide one or more external voltage identifiers (VIDext) via integrated circuit terminals 32. In an alternate embodiment, integrated circuit terminals 32 coupled to controller 28 may not be present, where controller 28 would not provide voltage identifiers externally. Controller 28 includes registers 30 which may be used to store voltage and frequency states of processor 16. For example, in one embodiment, controller 28 may include a dynamic voltage and frequency scaling (DVFS) controller, where registers 30 includes various DVFS states, each state indicating a particular voltage and corresponding frequency, as will be described in more detail in reference to FIG. 3 below.

Voltage regulator 26 provides a substantially fixed power supply voltage, VDDmem, to power supply selector 21 of memory 18. Voltage regulator 24, in response to VID, provides a power supply voltage, VDDlogic, to processor 16 and memory 18 (including both periphery 20 and power supply selector 21), where the value of VDDlogic is scalable, as controlled by the VID output of controller 28. In one embodiment, VDDmem is greater than VDDlogic. Alternatively, VDDmem may be greater than or equal to VDDlogic.

In one embodiment, while VDDlogic remains above a minimum operating voltage required for successful reads of memory array 22, power supply selector 21 selects VDDlogic as the memory operating voltage provided to memory array 22, such that the memory operating voltage is substantially equal to VDDlogic. When VDDlogic is scaled to a voltage that is below the minimum memory operating voltage required for reads, power supply selector 21 selects the higher voltage, VDDmem, during read cycles to ensure that reads can still be successfully performed. In this manner, the memory operating voltage provided to memory array 22 is increased when needed to ensure successful reads (while power supply selector 21 may continue to provide the scaled down VDDlogic to memory array 22 when reads are not occurring). However, note that in one embodiment, VDDlogic may be scaled down even lower to a voltage that, even with power supply selector 21 selecting the higher VDDmem, memory 18 would no longer perform reads properly. For example, the differential between this further scaled down VDDlogic and the higher VDDmem may be so great that switching from VDDlogic to VDDmem by power supply selector 21 would result in deleterious effects, such as bit flipping where the data stored in memory array 22 is no longer accurate.

Also, in the illustrated embodiment, when VDDlogic is scaled to a voltage that is below the minimum operating voltage required for writes, write cycles cannot successfully be performed. In an alternate embodiment, another voltage regulator, similar to voltage regulator 26, may be used to provide a substantially fixed power supply output (e.g. VDDmem-write) that is less than VDDlogic and which can be used during write cycles to help perform the write. In this embodiment, power supply selector 21 would select the lower voltage, VDDmem-write, during write cycles, as needed. For example, in this alternate embodiment, when VDDlogic is scaled to a voltage that is below the minimum operating voltage required for writes, power supply selector selects the lower voltage, VDDmem-write, during the write cycles to ensure that writes can still be successfully performed, since a lower memory operating voltage is helpful for write cycles. In this manner, the memory operating voltage provided to memory array 22 can be decreased when needed to ensure successful writes (while power supply selector 21 may continue to provide the scaled down VDDlogic to memory array 22 when writes are not occurring). Also, VDDlogic may be scaled down even lower to a voltage that, even with power supply selector 21 selecting the lower VDDmem-write to help the write cycle, memory 18 would no longer be able to perform writes properly.

Therefore, note that different types of thresholds can be defined for memory array 22. For example, a first minimum VDDlogic read voltage may indicate the minimum VDDlogic voltage where memory array 22 can perform reads using VDDlogic rather than VDDmem. Also, a second minimum VDDlogic read voltage, which is a lower minimum than the first VDDlogic read voltage, may indicate the minimum VDDlogic voltage where memory array 22 can perform reads, even if there is a switch to the higher VDDmem. That is, when VDDlogic falls below the second minimum VDDlogic voltage, not even a switch to VDDmem may ensure proper read operations. In an alternate embodiment, note that only a single minimum VDDlogic read voltage may be indicated, such as in the case where an increase to VDDmem is not available. Also, a minimum VDDlogic write voltage may indicate the minimum VDDlogic voltage at which memory array 22 can perform write operations. In one embodiment (in which VDDmem-write, as described above, is available) first and second minimum VDDlogic write voltages can be defined, where the first minimum VDDlogic write voltage may indicate the minimum memory operating voltage allowed for writes without a decrease of the memory operating voltage to VDDmem-write and the second minimum VDDlogic write voltage (less than the first minimum VDDlogic write voltage) may indicate the minimum memory operating voltage allowed for writes even with a decrease of the memory operating voltage to VDDmem-write. Also, note that there is a minimum data retention voltage such that if the memory operating voltage falls below this minimum data retention voltage, the data in memory array 22 may be lost. Furthermore, note that there may be a minimum standby voltage for memory array 22 which represents a minimum operating voltage allowable for memory array 22 during standby.

In alternate embodiments, other types of minimum read or write operating voltages can be defined for memory array 22. For example, in addition to the first and second minimum VDDlogic read voltages described above, other minimum read voltages may be defined such as a third minimum VDDlogic read voltage indicating the minimum voltage where memory array 22 can perform reads using VDDlogic rather than VDDmem when error correction code (ECC) is used. In this case, this third minimum VDDlogic read voltage (without increasing the memory operating voltage to VDDmem but with the use of ECC) may be less than the first minimum VDDlogic read voltage (without increasing the memory operating voltage to VDDmem and without the use of ECC) but greater than the second minimum VDDlogic read voltage (with increasing the memory operating voltage to VDDmem and without ECC). That is, by enabling ECC, a lower minimum read voltage may be acceptable for proper reads due to the use of ECC. Also, in addition to the first, second, and third minimum VDDlogic read voltages described above, a fourth minimum VDDlogic read voltage may be defined which indicates the minimum VDDlogic read voltage where memory array 22 can perform reads, even with a switch to VDDmem and the use of ECC. In one embodiment, this fourth minimum read voltage is less than the first, second, and third minimum VDDlogic read voltages described above.

Similarly, note that the same type of minimum voltages which take into consideration the use of ECC can be defined for the minimum write voltages described above. That is, rather than defining a single minimum VDDlogic write voltage below which writes cannot be performed (as was described in reference to FIG. 1), an alternate embodiment may instead use the first and second minimum VDDlogic write voltages described above, and may additionally use third and fourth minimum VDDlogic write voltages where ECC is also used, as was described in reference to the read voltages above.

Therefore, note that, as used herein, a minimum read voltage of memory array 22 can refer to a single minimum VDDlogic read voltage below which reads cannot be successfully performed, or may refer to one or more different types of minimum VDDlogic read voltages, such as, for example, those described above (e.g. the first, second, third, fourth minimum VDDlogic read voltages, other minimum VDDlogic read voltages, or combinations thereof). Similarly, a minimum write voltage of memory array 22 can refer to a single minimum VDDlogic write voltage below which writes cannot be successfully performed, or may refer to one or more different types of minimum VDDlogic write voltages, such as, for example, those described above (e.g. the first, second, third, fourth minimum VDDlogic write voltages, other minimum VDDlogic write voltages, or combinations thereof). Similarly, in alternate embodiments, other minimum read and write voltages may be defined which indicate different minimums depending on various other types of conditions. Also, in alternate embodiments, minimum read voltages can be combined with minimum write voltages, such that a same minimum voltage can be used for both reads and writes. Also, note that as used herein, a minimum operating voltage of memory array 22 can refer to any one or more of the minimum read, write, retention, or standby voltages (or combinations thereof) described above.

In one embodiment, controller 28 indicates to power supply selector 21 which power supply to select, VDDmem or VDDlogic (or, if available, VDDmem-write), by monitoring the VDDlogic VID selected within controller 28 (which will be described in more detail in reference to FIG. 3) and corresponds to the desired value for VDDlogic, and determining when the VDDlogic VID indicates a voltage that is below any of the minimum VDD logic voltages described above. Also, in one embodiment, a signal may be provided by controller 28 in response to the selected VDDlogic VID being below one or more of the minimum read or write operating voltages described above.

In the illustrated embodiment, when VDDlogic is to fall below the first minimum operating voltage, power supply selector 21 selects the higher voltage, VDDmem, to increase the memory operating voltage provided to memory array 22 during reads. However, in an alternate embodiment, VDDlogic may be boosted during reads through the use of a charge pump, where this boosted VDDlogic is provided to memory array 22 for reads. In yet another embodiment, VDDmem can be provided to memory array 22 always as the memory operating voltage, where VDDmem may also be scalable such that it may be scaled down, under the control, for example, of controller 28, to conserve power when possible (such as when it is known that reads will not be performed for a period of time).

In alternate embodiments, note that system 10 may include any number of voltage regulators used to output various different supply voltages for use by different circuitry, such as, for example, by different voltage domains within system 10 or processor 16. Alternatively, voltage regulators 24 and 26 can be implemented as a single voltage regulator with multiple outputs. Also, in the illustrated embodiment, data processing system 10 is implemented as a single IC. However, in alternate embodiments, any number of ICs may be used. For example, in one embodiment, voltage regulators 24 and 26 may be implemented with one or more separate ICs. One or more memories such as memory 18 can also be implemented with one or more separate ICs. Processor 16 may be any type of processor such as, for example, a microcontroller, microprocessor, digital signal processor, etc., and operates as known in the art. Therefore, operation of processor 16 will only be discussed to the extent necessary to describe various embodiments of the present invention. Alternatively, processor 16 may be any type of functional circuit in system 10. In one embodiment, the functional circuit is exclusive of memory 18.

As described above, memory 18 has one or more minimum operating voltages, as was described above in reference to, for example, the first and second minimum VDDlogic read voltages, the minimum VDDlogic write voltage, and the minimum data retention voltage. Due to variations in manufacturing, though, these minimum operating voltages of a memory may differ across a range of parts. Therefore, one memory may have different minimum operating voltages as compared to another memory on a different IC. Therefore, in one embodiment, these minimum operating voltages are determined for each part and stored in non-volatile registers on each part. For example, in one embodiment, memory 18 is tested to determine the minimum operating voltages and these voltages or values representative of these voltages are then stored in non-volatile registers 12.

For example, referring to FIG. 1, BIST 14 may include any type of circuitry to perform any type of built-in self test. In one embodiment, BIST 14 includes circuitry used to test for minimum operating voltages for memory 18. For example, BIST 14 may include circuitry to determine one or more of the minimum operating voltages discussed above. BIST 14 may also include other circuitry for determining other types of minimum operating voltages or other parameters. BIST 14 may return these values to processor 16 which may then provide these values to be written to non-volatile registers 12.

Figure 2:
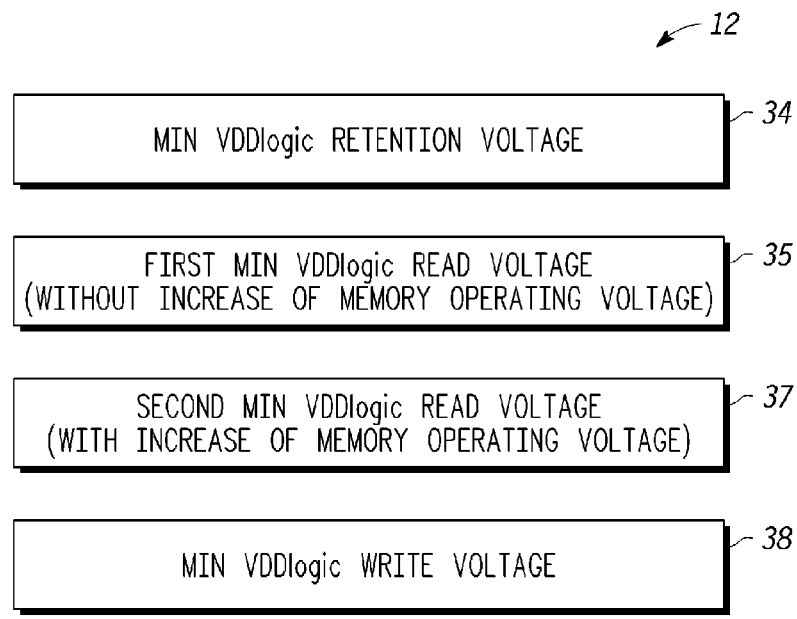
FIG. 2 illustrates the non-volatile registers of FIG. 1 in accordance with one embodiment of the present invention.

FIG. 2 illustrates one embodiment of non-volatile registers 12. The embodiment of FIG. 2 includes one or more registers which store a minimum VDDlogic retention voltage 34 and a first minimum VDDlogic read voltage 35 (without the increase of the memory operating voltage). Note that the minimum VDDlogic read voltage 35 (without the increase of the memory operating voltage) refers to the minimum voltage VDDlogic should have (within normal margins) in order for reads to be performed successfully. Note also that as long as VDDlogic is at or above this minimum voltage, the memory operating voltage need not be increased to the higher VDDmem, as was described above. That is, so long as VDDlogic is at or above this minimum voltage, VDDlogic can be provided as the memory operating voltage.

Note that first minimum VDDlogic read voltage 35 may also be referred to as a minimum read memory operating voltage. That is, while VDDlogic remains above the first minimum VDDlogic read voltage, the memory operating voltage is substantially equal to VDDlogic. The first minimum VDDlogic read voltage 35 may also be referred to as a minimum switching voltage since these values can be used to determine when a switch is to be performed from one regulated power supply (e.g. VDDlogic) to another regulated power supply (e.g. VDDmem).

In the illustrated embodiment of FIG. 2, non-volatile registers 12 also store a second minimum VDDlogic read voltage 37 (with the increase of the memory operating voltage). As was described above in reference to FIG. 1, there is a point where VDDlogic may be scaled down to such a level that even with power supply selector 21 selecting the higher VDDmem, operation of memory 18 may still fail. For example, this may be due to the large differential in voltage values between the scaled down VDDlogic and the higher VDDmem. Therefore, in one embodiment, BIST 14 may also include circuitry to determine these minimums, and processor 16 may therefore also store these minimums in non-volatile registers 12.

In the illustrated embodiment of FIG. 2, non-volatile registers 12 also store a minimum VDDlogic write voltage 38 which, as described above, can refer to the minimum voltage VDDlogic must have (within normal margins) in order for writes to be performed successfully. Note that minimum VDDlogic write voltage 38 may also be referred to as the minimum write memory operating voltage. In an alternate embodiment, non-volatile registers 12 can instead include a first and a second minimum VDDlogic write voltage (corresponding to minimum VDDlogic write voltages without or with a decrease to VDDmem-write, respectively). In this alternate embodiment, note that the first minimum VDDlogic write voltage can also be referred to as a minimum write memory operating voltage or a minimum switching voltage, for reasons analogous to those provided above with respect to first minimum VDDlogic read voltage 35.

Note that in the example of FIG. 2, separate read and write voltages are provided; however, they may be combined such that a same or single minimum is set for both reads and writes. Also, note that any number of non-volatile registers may be used. Furthermore, any number of minimum operating voltages or other operating parameters of memory 18 may be included. For example, in one embodiment, second minimum voltage 37 may not be present, or other minimum operating voltages, such as a minimum standby voltage or those that were described above in reference to the use of ECC, may be present. Also, minimums for various different memories present within a system may be stored into non-volatile registers 12. In one embodiment, encoded versions of the minimum voltages (i.e. VIDs for each minimum voltage) may be stored instead where encoded versions of the operating voltages (e.g. VDDlogic VIDs) are monitored. In one embodiment, non-volatile registers 12 may be implemented as programmable fuses. Alternatively, they may be implemented as volatile registers. For example, in one embodiment, the volatile registers may store minimum operating voltages that represent the worst case across a group of parts.

Also, note that there may be other ways to determine these minimum values stored into non-volatile registers 12. That is, BIST 14 may not be present, or, even if present, BIST 14 may not perform the determination of the minimum operating voltages. In an alternate embodiment, an external tester may be used to apply a testing protocol external from system 10 during or after manufacture of system 10 to determine the minimum operating voltages. That is, other testing circuitry, either internal to system 10 or external to system 10, may be used to determine these values. In yet another alternate embodiment, different types of algorithms may be used to determine these values for each memory (i.e. for each IC or part).

In one embodiment, regardless of whether BIST 14 is used or another tester is used, the determination of the minimum operating voltages is made specifically for memory 18 (and may be made specifically for any number of memories that may be present in system 10). That is, each memory can be separately characterized with these minimum operating voltages which may allow, for example, for improved binning, for improved customer control, etc. By making the determination specifically per memory (i.e. per part or IC), a user or customer does not need to assume and plan for a worst case scenario across all parts because they may have one or more parts that actually works better. That is, by binning according to the worst case scenario, a particular part may be restricted from use even though that particular part is capable of operating at a voltage below what binning allows. Other examples of how to make use of the information in non-volatile registers 12 will be discussed in reference to FIGS. 3 and 4.

Figure 3:
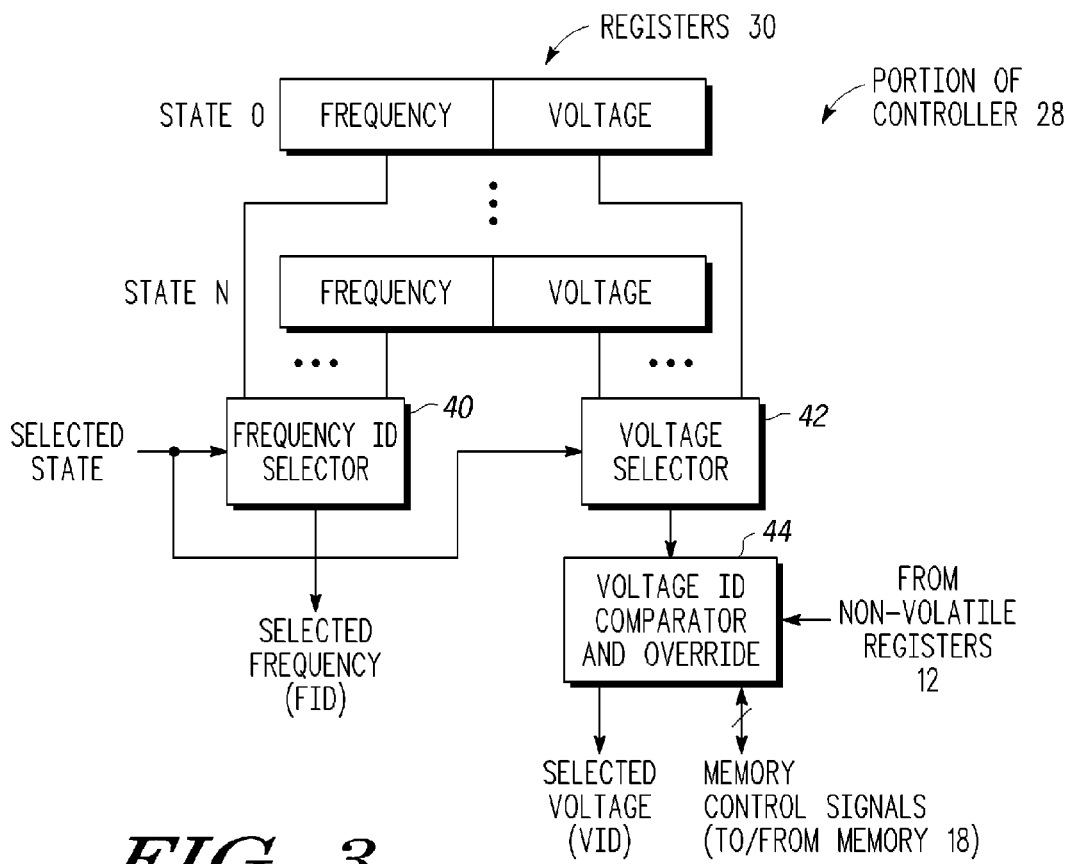
FIG. 3 illustrates a portion of controller 28 in accordance with one embodiment of the present invention.

FIG. 3 illustrates one embodiment of a portion of controller 28. Registers 30 includes N+1 registers, each corresponding to a voltage/frequency state. That is, a corresponding encoded frequency and voltage is provided for each of state 0 through state N (where each of state 0 through N may be referred to as a DVFS state). Controller 28 may provide a selected state signal to select a DVFS state (where controller 28 may provide this signal based on a state selected by processor 16). The selected state signal is provided to frequency selector 40 to select one of the N+1 states, such that the selected frequency is provided by frequency selector 40. The selected state signal is also provided to voltage selector 42 such that voltage selector 42 provides the corresponding selected encoded voltage to a comparator and override 44. Therefore, the frequency and voltage states selected by the selected state signal correspond to the desired frequency and voltage. For example, the selected voltage state corresponds to the desired voltage value for VDDlogic. Comparator and override 44 uses the information stored in non-volatile registers 12 to determine if the selected voltage value output by voltage selector 42 (i.e. the desired voltage value for VDDlogic) is appropriate for memory 18. For example, if the selected voltage value is below second minimum read voltage 37 or minimum write voltage 38, operation of memory 18 may fail. In this case, comparator and override 44 may force a different voltage selection that remains above the appropriate minimum voltage. Therefore, controller 28 may adjust VID accordingly to prevent regulator 24 from outputting the desired voltage selected by the selected state signal. Therefore, while the selected frequency may remain low, the corresponding selected low voltage is overridden to help ensure continued proper operation of memory 18.

Similarly, comparator and override 44 can use first minimum VDDlogic read voltage 35 to determine whether an increase to VDDmem is needed. That is, if the voltage selected by voltage selector 42 in response to the selected state signal indicates a voltage that is less than first minimum VDDlogic read voltage 35 (but still greater than second minimum VDDlogic read voltage 37), comparator and override 44 can send a signal to power supply selector 21 (via the memory control signals) to indicate to power supply selector 21 to select VDDmem rather than VDDlogic to provide as the memory operating voltage to memory array 22. In an alternate embodiment in which VDDmem-write is also used (along with first and second minimum VDDlogic write voltages), comparator and override 44 can send a signal to power supply selector 21 to indicate when a switch from VDDlogic to VDDmem-write is needed. Therefore, comparator and override 44 can adjust or override the selected voltage VID to control VDDlogic as needed, as well as signal to power supply selector 21 when a switch in power supply voltages is needed. Comparator and override 44 can make these adjustments or send these signals in response to comparing the selected or desired voltage with one or more of the various minimum operating voltages that are stored in non-volatile registers 12.

Figure 4:
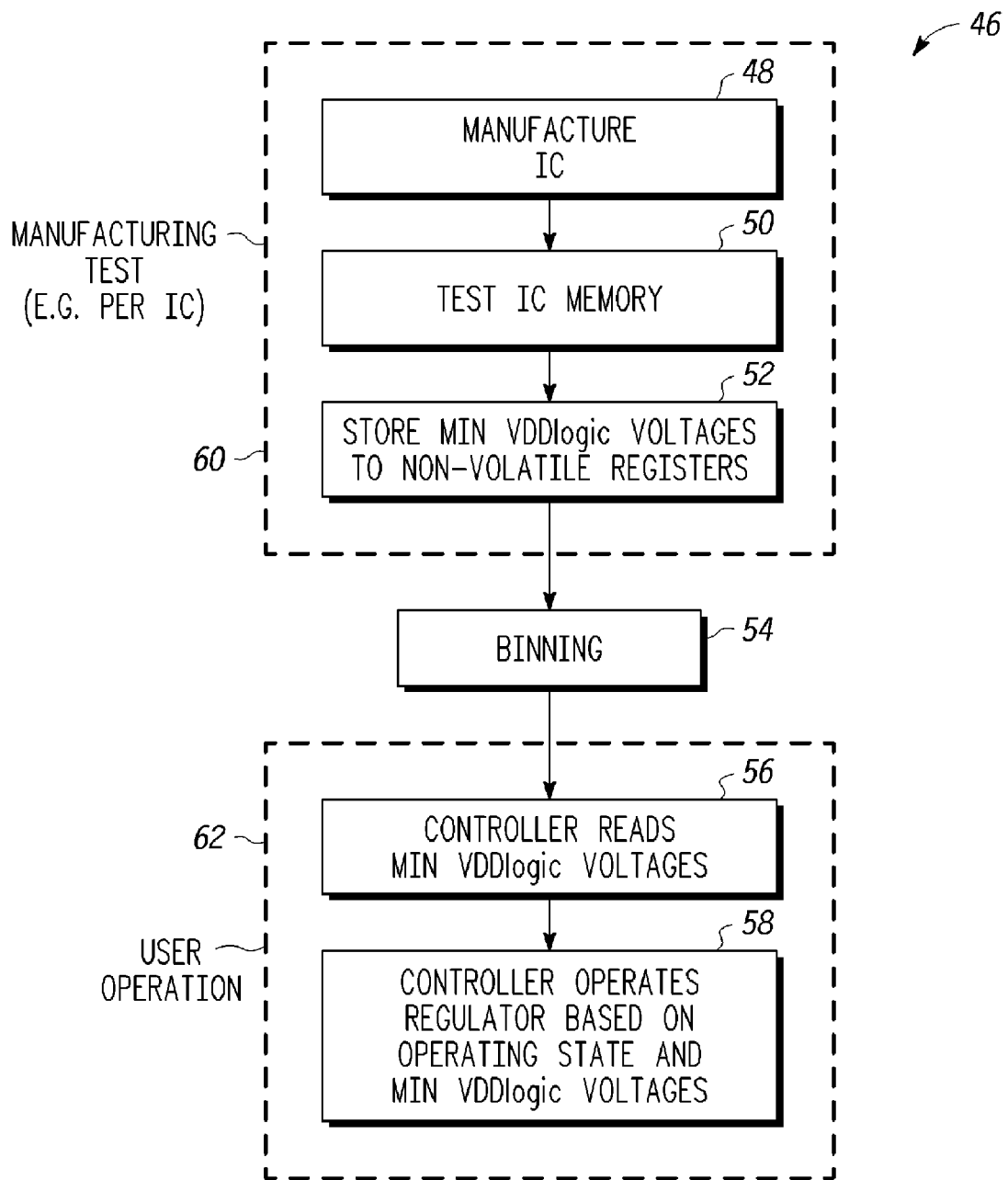
FIG. 4 illustrates a flow for testing and operating an integrated circuit, such as, for example, the data processing system of FIG. 1, in accordance with one embodiment of the present invention.

FIG. 4 illustrates a flow 46 which may be used to determine and use the minimum operating voltages of FIG. 2. For example, flow 46 includes a manufacturing test portion 60 which is performed per part (i.e. per IC), and includes a user operation portion 62. Manufacturing test portion 60 includes manufacturing the IC (block 48) and testing the IC memory (block 50). For example, as discussed above, this may be performed by BIST 14 or some other tester or method of testing. Manufacturing test portion 60 also includes storing the values of the minimum VDDlogic voltages or values representative of the actual values, determined by the IC testing performed in block 50, to the non-volatile registers of the IC being tested, such as non-volatile registers 12, (block 52). In one embodiment, the minimum VDDlogic voltages can be determined per a group of parts or ICs. For example, testing can be performed on a representative IC of a particular lot, where those values are stored in the non-volatile registers of each IC in the lot.

After manufacturing test portion 60, the stored values may be used for improved power binning. For example, the tested ICs may be binned according to finer power or speed bins since each part is tested individually for the minimum VDDlogic voltages. Furthermore, a customer can be given more precise information about each specific IC as opposed to relying on a global set of worst case minimums.

After binning 54, flow 46 enters user operation portion 62. User operation portion 62 includes using a controller (such as controller 28) to read the minimum VDDlogic voltages (in block 56) and operating a regulator (such as regulator 26) based on an operating state (such as one of state 0 to N) and on the minimum VDDlogic voltages (in block 58). That is, as was described in reference to FIG. 3, controller 28 may control regulator 24 based on both the selected state of state 0 to N and the information stored in non-volatile registers 12. For example, controller 28 may use the information stored in non-volatile registers 12 to selectively override all or a portion of the selected state.

By now it should be appreciated that there has been provided a technique for determining and storing specific minimum operating voltages for each IC. In this manner, by determining and storing this information unique to each IC (i.e. by separately characterizing each IC), an IC may be operated at its lowest voltage. For example, by binning according to the worst case scenario, an IC may be restricted from use even though a particular IC or part is capable of operating at a voltage below what binning allows. This can be addressed by determining and storing information unique to each IC, as discussed above. Also, with the stored information, the increase of the memory operating voltage (such as from VDDlogic to VDDmem, as was described above), may be performed only when needed by using the stored first minimum values as triggering points for increasing the memory operating voltage rather than relying on a global value (i.e. a value that is common to all ICs). For example, if global values are relied on rather than the particular values determined for each IC, a power selector may switch to a higher power supply voltage (such as VDDmem) when it really was not necessary because the particular IC may have been able to operate properly at the lower voltage, thus unnecessarily consuming power. Furthermore, the decision to increase the memory operating voltage can also be made without a user's knowledge or intervention.

In one embodiment, a method includes providing an integrated circuit with a memory, operating the memory with an operating voltage, determining a value of a minimum operating voltage of the memory, providing a non-volatile memory (NVM) location, and storing the value of the minimum operating voltage of the memory in the NVM location.

In a further embodiment, the step of testing the memory is further characterized by the minimum operating voltage comprising one of a group consisting of minimum retention voltage, minimum write voltage, minimum read voltage, and a minimum standby voltage.

In another further embodiment, the step of providing the integrated circuit with the memory is further characterized by the memory comprising one of a group consisting of dynamic random access memory and static random access memory.

In another further embodiment, the step of providing the NVM location is further characterized by the NVM location comprising a non-volatile register.

In another further embodiment, the method further includes providing a functional circuit on the integrated circuit exclusive of the memory, providing a first regulated voltage to the functional circuit, providing a second regulated voltage, and providing the first regulated voltage as the operating voltage of the memory when the first regulated voltage is at least the value of the minimum operating voltage and the second regulated voltage as the operating voltage of the memory when the first regulated voltage is less than the value of the minimum operating voltage. In yet a further embodiment, the method further includes determining a value of a minimum switching voltage of the first regulated voltage for switching from the first regulated voltage to the second regulated voltage in response to the first regulated voltage going below the minimum operating voltage, and storing the value of the minimum switching voltage in the NVM location. In yet a further embodiment, the method further includes providing a signal in response to a desired value for the first regulated voltage being below the minimum operating voltage.

In another further embodiment, the method further includes providing a controller on the integrated circuit that selects an operating value for the operating voltage of the memory, and providing the operating voltage to the memory at a value at least as great as the minimum operating voltage in response to the operating value selected by the processor being below the minimum operating voltage.

In another further embodiment, the method further includes providing the value of the minimum operating voltage external to the integrated circuit.

In another further embodiment, the step of determining is further characterized as performing a test applied externally from the integrated circuit.

In another embodiment, an integrated circuit includes a memory that operates using an operating voltage, wherein the memory is characterized as having a minimum operating voltage, and a memory location that stores a value representative of the minimum operating voltage.

In a further embodiment of the another embodiment, the integrated circuit further includes a first voltage regulator for supplying a first regulated voltage, a circuit that provides a function and uses the first regulated voltage, a second voltage regulator for supplying a second regulated voltage, and a power supply selector that supplies the first regulated voltage as the operating voltage of the memory when the first regulated voltage is at least the minimum operating voltage and supplies the second regulated voltage as the operating voltage when the first regulated voltage is below the minimum operating voltage. In yet a further embodiment of the another embodiment, the circuit that provides a function includes a processor, and the integrated circuit further includes a built-in self test (BIST) circuit, coupled to the processor, useful in determining the minimum operating voltage. In another yet further embodiment, the memory is further characterized as having a value of a minimum switching voltage of the first regulated voltage for switching from the first regulated voltage to the second regulated voltage in response to the first regulated voltage going below the minimum operating voltage, and the memory location is further characterized as storing the value of the minimum switching voltage.

In another further embodiment of the another embodiment, the minimum operating voltage comprises one of a group consisting of minimum retention voltage, minimum read voltage, minimum write voltage, and minimum standby voltage. In yet a further embodiment, the minimum operating voltage comprises another one of the group consisting of minimum retention voltage, minimum read voltage, minimum write voltage, and minimum standby voltage.

In another further embodiment of the another embodiment, the memory comprises one of a group consisting of a static random access memory and a dynamic random access memory.

In another further embodiment of the another embodiment, the integrated circuit includes a processor that selects an operating value for the operating voltage of the memory, and means for providing the operating voltage to the memory at a value at least as great as the minimum operating voltage in response to the operating value selected by the processor being below the minimum operating voltage.

In another further embodiment of the another embodiment, the memory location is characterized as being a non-volatile register.

In yet another embodiment, a method includes providing an integrated circuit with a memory that uses an operating voltage, testing the memory to determine the operating voltage of the memory that is a minimum operating voltage, and storing, in a non-volatile manner, the value of the minimum operating voltage.

In a further embodiment of the yet another embodiment, the method further includes providing a functional circuit on the integrated circuit exclusive of the memory, providing a first regulated voltage to the functional circuit, providing a second regulated voltage, and providing the first regulated voltage as the operating voltage of the memory when the first regulated voltage is at least the value of the minimum operating voltage and the second regulated voltage as the operating voltage of the memory when the first regulated voltage is less than the value of the minimum operating voltage.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different data processing systems. For example, although FIG. 1 and the discussion thereof describe an exemplary data processing system architecture, this exemplary architecture is presented merely to provide a useful reference in discussing various aspects of the invention. Of course, the description of the architecture has been simplified for purposes of discussion, and it is just one of may different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Furthermore, those skilled in the art will recognize that boundaries between the functionality of the above described operations are merely illustrative. The functionality of multiple operations may be combined into a single operation, and/or the functionality of a single operations may be distributed in additional operations. Moreover, alternative embodiments may include multiple instances of a particular operation, and the order of operations may be altered in various other embodiments.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The term "plurality", as used herein, is defined as two or more than two. The term another, as used herein, is defined as at least a second or more.

The term "coupled", as used herein, is defined as connected, although not necessarily directly, and not necessarily mechanically.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described.

Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an"

limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method, comprising:
providing an integrated circuit with a memory;
operating the memory with an operating voltage;
determining a value of a minimum operating voltage of the memory;
providing a non-volatile memory (NVM) location;
storing the value of the minimum operating voltage of the memory in the NVM location;
providing a functional circuit on the integrated circuit exclusive of the memory;
providing a first regulated voltage to the functional circuit;
providing a second regulated voltage, the second regulated voltage is greater than the first regulated voltage;
providing the first regulated voltage as the operating voltage of the memory when the first regulated voltage is at least the value of the minimum operating voltage; and
providing the second regulated voltage as the operating voltage of the memory when the first regulated voltage is less than the value of the minimum operating voltage, wherein while the second regulated voltage is provided as the operating voltage of the memory, the first regulated voltage is provided to the functional circuit.

2. The method of claim 1, wherein the step of testing the memory is further characterized by the minimum operating voltage comprising one of a group consisting of minimum write voltage, minimum read voltage, and a minimum standby voltage.

3. The method of claim 1, wherein the step of providing the integrated circuit with the memory is further characterized by the memory comprising one of a group consisting of dynamic random access memory and static random access memory.

4. The method of claim 1, wherein the step of providing the NVM location is further characterized by the NVM location comprising a non-volatile register.

5. The method of claim 1, further comprising:
providing a signal in response to a desired value for the first regulated voltage being below the minimum operating voltage.

6. The method of claim 1, further comprising:
providing a controller on the integrated circuit that selects an operating value for the operating voltage of the memory; and
providing the operating voltage to the memory at a value at least as great as the minimum operating voltage in response to the operating value selected by the processor being below the minimum operating voltage.

7. The method of claim 1, further comprising providing the value of the minimum operating voltage external to the integrated circuit.

8. The method of claim 1, wherein the step of determining is further characterized as performing a test applied externally from the integrated circuit.

9. An integrated circuit, comprising:
a memory that operates using an operating voltage, wherein the memory is characterized as having a minimum operating voltage;
a memory location that stores a value representative of the minimum operating voltage;
a first voltage regulator for supplying a first regulated voltage;
a circuit that provides a function and uses the first regulated voltage;
a second voltage regulator for supplying a second regulated voltage, wherein the second regulated voltage is greater than the first regulated voltage; and
a power supply selector that supplies the first regulated voltage as the operating voltage of the memory when the first regulated voltage is at least the minimum operating voltage and supplies the second regulated voltage as the operating voltage when the first regulated voltage is below the minimum operating voltage, wherein while the second regulated voltage is supplied as the operating voltage, the circuit uses the first regulated voltage.

10. The integrated circuit of claim 9, wherein the circuit that provides a function comprises a processor, further comprising: a built-in self test (BIST) circuit, coupled to the processor, which determines the minimum operating voltage.

11. The memory of claim 9, wherein the minimum operating voltage comprises one of a group consisting of minimum retention voltage, minimum read voltage, minimum write voltage, and minimum standby voltage.

12. The memory of claim 11, wherein the minimum operating voltage comprises another one of the group consisting of minimum retention voltage, minimum read voltage, minimum write voltage, and minimum standby voltage.

13. The memory of claim 9, wherein the memory comprises one of a group consisting of a static random access memory and a dynamic random access memory.

14. The memory of claim 9, further comprising:
a processor that selects an operating value for the operating voltage of the memory; and
means for providing the operating voltage to the memory at a value at least as great as the minimum operating voltage in response to the operating value selected by the processor being below the minimum operating voltage.

15. The memory of claim 9, wherein the memory location is characterized as being a non-volatile register.

16. A method, comprising:
providing an integrated circuit with a memory that uses an operating voltage;
testing the memory to determine the operating voltage of the memory that is a minimum operating voltage;
storing, in a non-volatile manner, the value of the minimum operating voltage;
providing a functional circuit on the integrated circuit exclusive of the memory;
providing a first regulated voltage to the functional circuit;
providing a second regulated voltage, wherein the second regulated voltage is greater than the first regulated voltage;
providing the first regulated voltage as the operating voltage of the memory when the first regulated voltage is at least the value of the minimum operating voltage; and
providing the second regulated voltage as the operating voltage of the memory when the first regulated voltage is less than the value of the minimum operating voltage, wherein while the second regulated voltage is provided as the operating voltage of the memory, the first regulated voltage is provided to the functional circuit.

* * * * *